(12) United States Patent
Muchherla et al.

(10) Patent No.: US 12,068,034 B2
(45) Date of Patent: Aug. 20, 2024

(54) TWO-PASS CORRECTIVE PROGRAMMING FOR MEMORY CELLS THAT STORE MULTIPLE BITS AND POWER LOSS MANAGEMENT FOR TWO-PASS CORRECTIVE PROGRAMMING

(71) Applicant: Micron Technology, Inc., Boise, ID (US)

(72) Inventors: Kishore Kumar Muchherla, Fremont, CA (US); Huai-Yuan Tseng, San Ramon, CA (US); Giovanni Maria Paolucci, Milan (IT); Dave Scott Ebsen, Minnetonka, MN (US); James Fitzpatrick, Laguna Niguel, CA (US); Akira Goda, Tokyo (JP); Jeffrey S. McNeil, Nampa, ID (US); Umberto Siciliani, Rubano (IT); Daniel J. Hubbard, Boise, ID (US); Walter Di Francesco, Avezzano (IT); Michele Incarnati, Avezzano (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 185 days.

(21) Appl. No.: 17/899,409

(22) Filed: Aug. 30, 2022

(65) Prior Publication Data
US 2024/0071510 A1 Feb. 29, 2024

(51) Int. Cl.
*G11C 16/10* (2006.01)
*G11C 16/08* (2006.01)
*G11C 16/34* (2006.01)

(52) U.S. Cl.
CPC ............ *G11C 16/102* (2013.01); *G11C 16/08* (2013.01); *G11C 16/3404* (2013.01)

(58) Field of Classification Search
CPC .... G11C 16/08; G11C 16/102; G11C 16/3404
See application file for complete search history.

(56) References Cited

U.S. PATENT DOCUMENTS

2024/0028252 A1* 1/2024 Muchherla ............ G11C 16/08

* cited by examiner

*Primary Examiner* — Son L Mai
(74) *Attorney, Agent, or Firm* — NICHOLSON DE VOS WEBSTER & ELLIOTT LLP

(57) ABSTRACT

Exemplary methods, apparatuses, and systems including a programming manager for controlling writing data bits to a memory device. The programming manager receives a first set of data bits for programming to memory. The programming manager writes a first subset of data bits to a first wordline during a first pass of programming. The programming manager writes a second subset of data bits of the first set of data bits to a buffer. The programming manager receives a second set of data bits for programming. The programming manager writes the second subset of data bits of the first set of data bits to the first wordline during a second pass of programming to increase a bit density of memory cells in the first wordline in response to receiving the second set of data bits.

20 Claims, 5 Drawing Sheets

TWO-PASS CORRECTIVE PROGRAMMING FOR MEMORY CELLS THAT STORE MULTIPLE BITS AND POWER LOSS MANAGEMENT FOR TWO-PASS CORRECTIVE PROGRAMMING

TECHNICAL FIELD

The present disclosure generally relates to corrective programming and power loss management of memory devices, and more specifically, relates to two-pass corrective programming of memory cells that each store multiple bits and power loss management for two-pass corrective programming.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
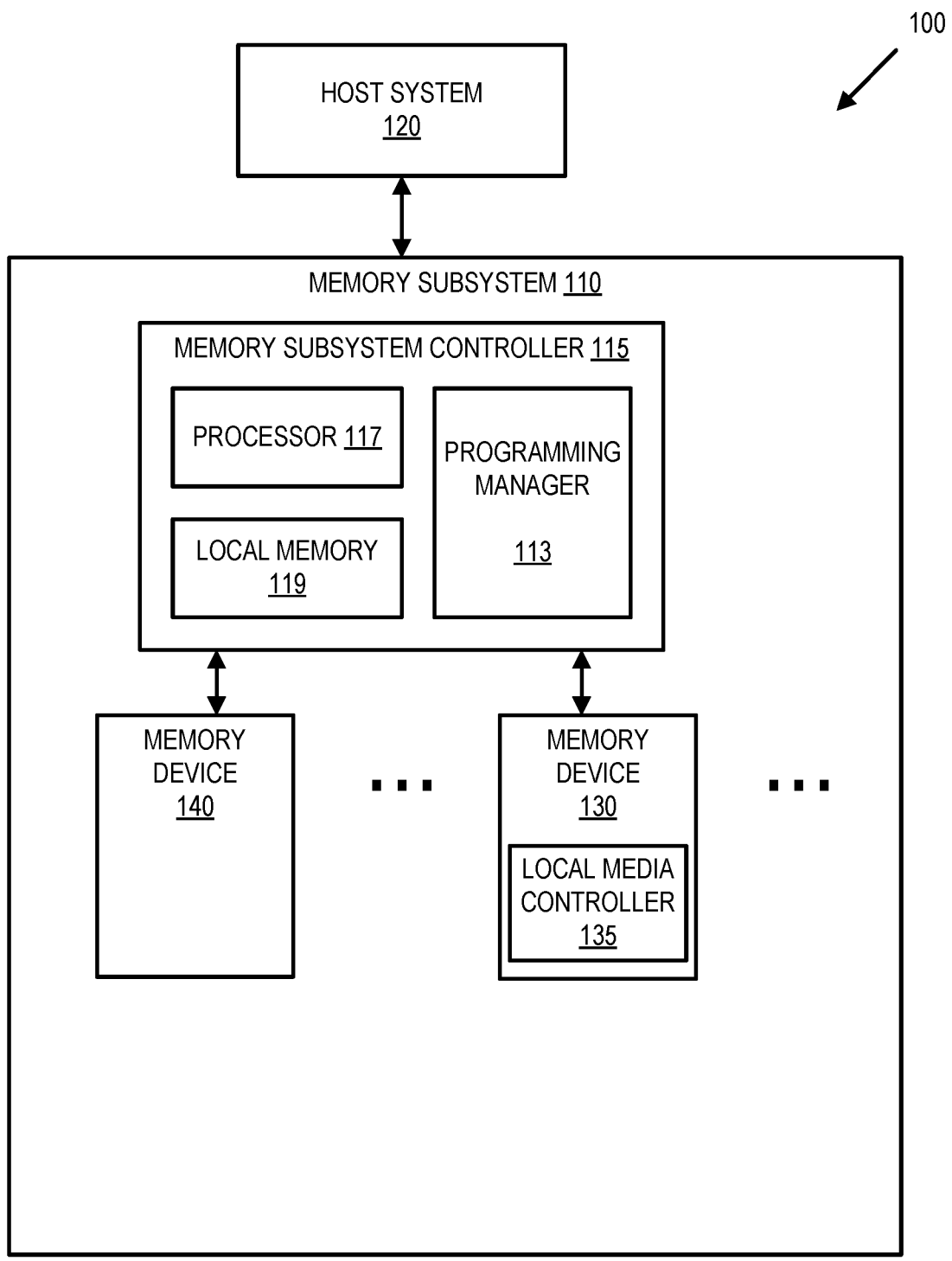
FIG. 1 illustrates an example computing system that includes a memory subsystem that performs programming passes in accordance with some embodiments of the present disclosure.

Aspects of the present disclosure are directed to two-pass corrective programming in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more die. One example of non-volatile memory devices is a negative-and (NAND) memory device. Other examples of non-volatile memory devices are described below in conjunction with FIG. 1. The die in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Using quad level cells improves memory storage but often results in large buffer requirements to buffer data bits such as with 16-16 two-pass programming. In 16-16 two-pass programming, the first pass includes coarse data programming and the second pass includes fine data programming. For example, coarse data programming programs QLC's to 16 threshold voltage (Vt) states (representing the 16 different combinations of values for 4 bits) but leaves the data in an unreadable state. To prevent data loss and otherwise provide access to the data, the corresponding data is also stored in a buffer until the second pass of fine data programming is complete, which leaves the data in a readable 16 Vt state. This large buffer requirement incurs an over provisioning penalty (additional storage that is outside of the storage space accessible to the user).

Aspects of the present disclosure address the above and other deficiencies by writing a subset of data bits to the memory in a readable state in a first pass and buffering the remainder of the set of data bits for writing to the memory in a second pass. By writing only a subset of data bits to memory, the first pass writes in a readable state and reduces the buffer size for data bits written in the second pass. During the second pass, the buffered bits are written to increase the bit density of the previously written memory cells. For example, the buffered subset of data bits can represent a selected page, such as a "top-page" (TP) of a set of four pages written to QLC memory.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and reads data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fiber Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random-access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a programming manager 113 that can select subsets of received data bits for first and second passes of programming to cells of the memory devices 130. In some embodiments, the controller 115 includes at least a portion of the programming manager 113. For example, the controller 115 can include a processor 117 (processing device) configured to execute instructions stored in local memory 119 for performing the operations described herein. In some embodiments, a programming manager 113 is part of the host system 120, an application, or an operating system.

The programming manager 113 controls how received data bits are written to the memory devices in multiple pass programming. In doing so, the programming manager 113 reduces the amount of data buffered per pass. For instance, if the programming manager 113 receives a first set of data bits for programming to memory. In an example, the first set of data bits includes four pages of data, the programming manager 113 can write a subset of the data to the memory devices in a readable state (e.g., three pages of data to a wordline of memory cells in an 8 Vt state). The programming manager 113 can write the remaining subset of bits (e.g., the last page of data) to a buffer, such as a NAND latch, SLC block, or volatile memory. The programming manager 113 can write the remaining subset of bits stored in the buffer to the memory device in a second pass of programming (e.g., the full four pages of data written to the wordline of memory cells in a sixteen Vt state). In one embodiment, the programming manager performs the second pass of programming after a second set of data bits (e.g., another four pages of data) is received. Further details with regards to the operations of the programming manager 113 are described below.

Figure 2:
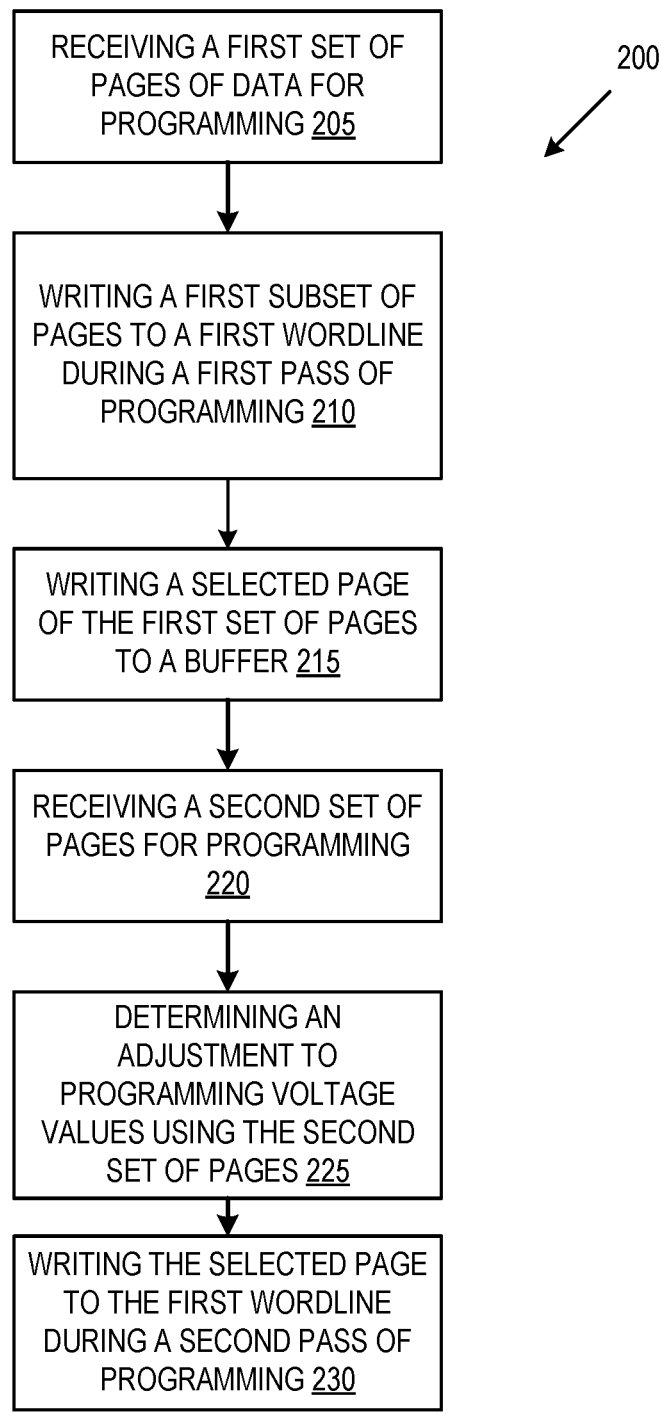
FIG. 2 illustrates an example of a process of performing programming passes in accordance with embodiments of the present disclosure.

FIG. 2 illustrates an example of a process of performing programming passes in accordance with embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the programming manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the programming manager 113 receives a first set of pages of data for programming. The programming manager 113 is configured to receive sets of data bits for programming to the memory devices. For example, the programming manager 113 can receive a data stream from the host system 120, the data stream including multiple sets of pages of data. In some embodiments, the programming manager 113 receives at least four pages of data for writing to a QLC wordline. Examples set forth herein refer to QLC wordlines and sets of pages of data, but other subdivisions of memory and other sets/groupings of data can be used.

At operation 210, the programming manager 113 writes a first subset of pages to a first wordline during a first pass of programming. The programming manager 113 selects a number of pages to write to the QLC's on a first wordline. For instance, the programming manager selects three pages of the first set of pages received in operation 205 to write to memory (e.g., an 8 Vt readable state similar to programming TLC memory). Because the programming manager 113 writes only a subset of the pages, e.g., three pages, to memory, the memory cells of the wordline are written in a readable 8 Vt state. In another embodiment, the programming manager 113 selects two pages and writes them to memory (e.g., in a 4 Vt readable state similar to programming MLC memory).

At operation 215, the programming manager 113 writes a selected page of the first set of pages to a buffer. In the example above in which the programming manager 113 writes a first subset of data made up of three pages to the first wordline, a second subset of data made up of the remaining one page (e.g., the fourth page such as the TP) is written by the programming manager 113 to a buffer location. The fourth page is accessible from the buffer in the event recovery or a read is necessary prior to writing the fourth page to the first wordline. In an embodiment the programming manager 113 writes a first subset including two pages to the first wordline, the programming manager 113 writes a second subset including the remaining two pages to the buffer.

At operation 220, the programming manager 113 receives a second set of pages for programming. Similar to the description above with regard to operation 205, the programming manager 113 is configured to receive multiple sets of data bits for programming to the memory devices. The programming manager 113 receives a second set of four pages of data for writing to a second QLC wordline.

At operation 225, the programming manager determines an adjustment to threshold voltage values using the second set of pages for programming the selected page to the first wordline. For example, after receiving the second set of pages for programming, the programming manager determines an adjustment voltage for writing the selected page in a second pass of programming, resulting in a wordline programmed in a 16 Vt state. The adjustment voltage can, e.g., account for disturbance or other parasitic effects that the programming manager 113 estimates will result from programming the second set of pages to an adjacent, second wordline. In some embodiments, the programming manager adjusts a threshold voltage by a first adjustment voltage for a number of pages of the second set of pages to be programmed in a first pass of programming. In other cases, the programming manager adjusts a threshold voltage by a different adjustment voltage for a different (e.g., greater or less pages) number of pages of the second set of pages to be programmed in a first pass of programming. The programming manager is configured to determine the adjustment voltage according to design parameters of the memory device. In one embodiment, the programing manager applies a larger adjustment voltage (a greater increase) when the number of pages of the second set of pages to be programmed in a first pass is fewer.

At operation 230, the programming manager 113 writes the selected page to the first wordline during a second pass of programming. The second pass of programming increases the bit density of the cells of the first wordline. For example, after receiving the second set of pages for programming, the programming manager 113 writes the last page from the buffer to the first wordline using the determined adjustment in threshold voltage values, completing the programming of first set of pages of data in a final programming state (e.g., a 16 Vt readable state for each QLC of a QLC wordline) for the particular type of memory cells.

Figure 3:
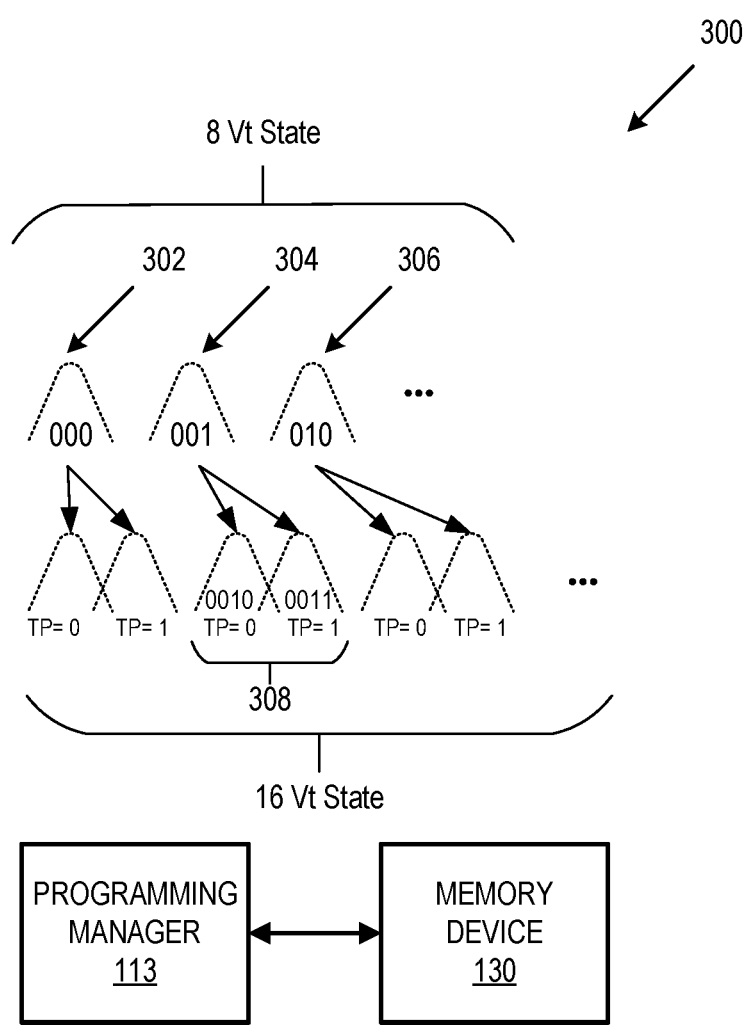
FIG. 3 is an example of applying an adjustment voltage to one or more bits of a wordline in accordance with some embodiments of the present disclosure.

FIG. 3 is an example of applying an adjustment voltage to one or more bits of a wordline in accordance with some embodiments of the present disclosure. As described above, the programming manager 113 writes the first QLC wordline in a memory device 130 by programming the wordline to an 8 Vt state during a first pass of programming. The programming manager 113 can perform the second pass of programming the first QLC wordline after receiving the second set of data bits including four pages of data to be written to a second QLC wordline. Examples set forth herein refer to QLC wordlines, 8 Vt states, and 16 Vt States, however other numbers of Vt states can be used depending on the initial and final programming states for each type of memory cell.

As depicted in FIG. 3, a QLC wordline 300 has a distribution of voltage values 302-306 for an 8 Vt state representing binary values 000, 001, 010, 011, 100, 101, 110, and 111. While the binary values are shown adjacent to each other, other arrangements such as using Gray code or different positions are possible. A second programming pass increases the possible distribution of voltage values to 16 Vt states representing binary values 0000, 0001, 0010, 0011, 0100, 0101, 0110, 0111, 1000, 1001, 1010, 1011, 1100, 1101, 1110, and 1111. In adding a bit, each binary value in the 8 Vt state can be shifted to represent two different binary values in the 16 Vt state. For example, if a first pass of programming includes programming a QLC to a binary value of 001, represented by voltage distribution values 304, the second pass of programming updates the QLC to a binary value of 0010 or 0011, represented by distribution of voltage values 308, depending on the value of the bit added by the buffered page (e.g., the top page TP).

As discussed with reference to operations 220 and 225, the programming manager 113 can apply an adjustment to the threshold voltage for the second pass of programming before writing a fourth page to the QLC wordline. For example, when three pages are written to the first QLC wordline in a first pass of programming, the fourth page is written to a buffer. After receiving a second set of four pages, the programming manager can adjust the threshold voltage before writing the fourth page to the QLC wordline depending on the second pass state of the second set of four pages. In one embodiment, the programming manager adjusts the threshold voltages for the final programming state by a first amount for a number of pages to be programmed in a first pass of the second set of four pages and a different amount (i.e., a second amount that is a greater increase in threshold voltage) for a different number of pages to be programmed in a first pass of the second set of four pages. As a result, the programming manager 113 accounts for any disturbance or parasitic impacts of programming the second wordline that can shift the voltage values of the first wordline. After the programming manager 113 programs the second wordline, the voltage values of the first wordline should fall within the expected voltage distributions of the intended 16 Vt state.

Figure 4:
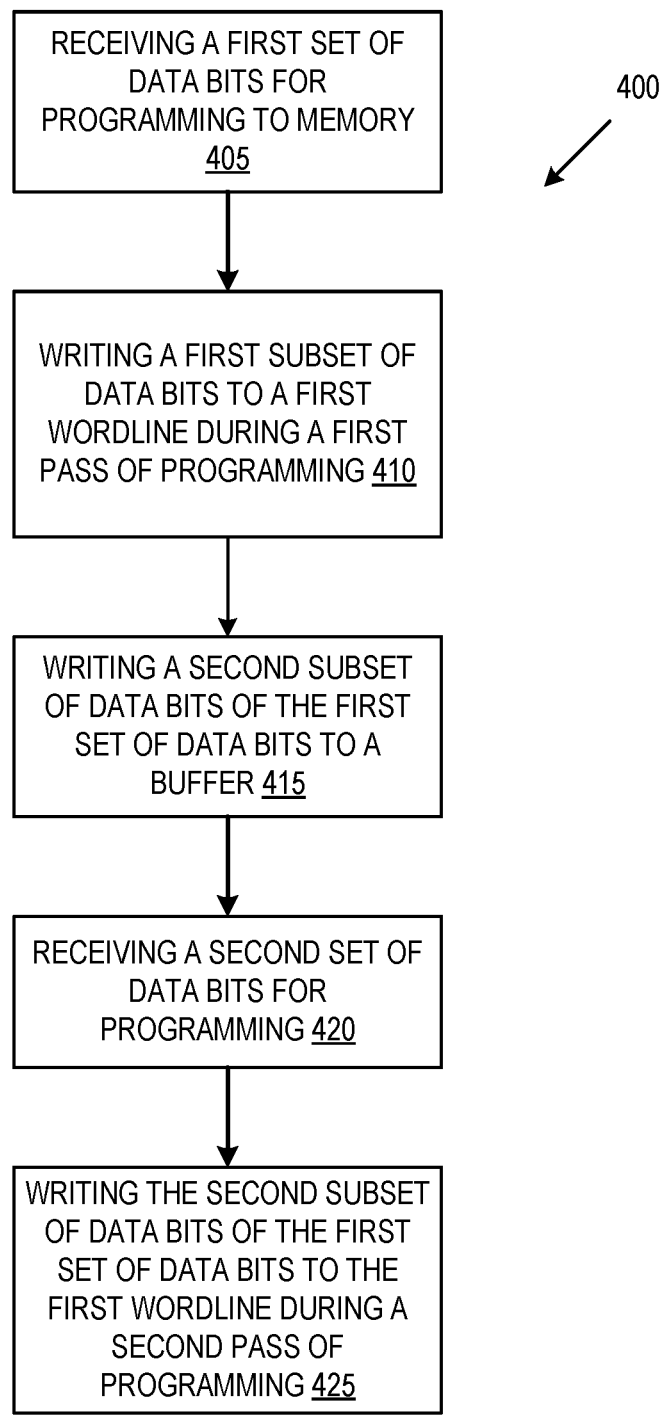
FIG. 4 is a flow diagram of an example method to perform programming passes in accordance with embodiments of the present disclosure.

FIG. 4 is a flow diagram of an example method 400 to perform programming passes in accordance with embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the programming manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the programming manager 113 receives a first set of data bits for programming to memory. As described with regard to operation 205 above, the programming manager 113 is configured to receive sets of data bits for programming to the memory devices. In some embodiments, the programming manager 113 receives four pages of data for writing to a wordline. In other embodiments, the programming manager receives any number of data bits that can be programmed to memory by the memory subsystem.

At operation 410, the programming manager 113 writes a first subset of data bits to a first wordline during a first pass of programming. From the first set of data bits received at operation 405, the programming manager 113 selects a first subset of data bits for writing to the first wordline and a second subset of data bits to write to the buffer. As described with regard to operation 210 above, the programming manager 113 performs a first pass of programming that writes the first subset of data bits in a readable state to the first wordline.

At operation 415, the programming manager 113 writes the second subset of the first set of data bits to a buffer. For instance, the second subset of data bits are the data bits of the first set of data bits that were not programmed to the first wordline during the first pass of programming. As described above with regard to operation 215, the programming manager writes the second subset of data bits to a different memory location than the first wordline, such as a buffer or a non-volatile memory location. As a result of the programming manager 113 writing the second subset of data bits to the buffer rather than the entire first set of data bits, the buffer size is reduced from the complete first set of data bits to the second subset of data bits. In a QLC wordline example, for a four-page set of data bits, the first subset includes three pages that are written to the wordline and a fourth page of data bits is written to the buffer, the buffer size is reduced by 75% as compared with buffering the complete first set of data bits.

At operation 420, the programming manager 113 receives a second set of data bits for programming to memory. As described above with regard to operation 220, the programming manager 113 receives a second set of pages for programming to a second wordline.

At operation 425, the programming manager writes the second subset of data bits of the first set of data bits to the first wordline during a second pass of programming. As described with above with regard to operation 225, the programming manager 113 writes the selected page or other subset of buffered bits to the first wordline during a second pass of programming to increase the bit density of the memory cells of the first wordline. Continuing with the previous example, in response to receiving the second set of four pages for programming to memory, the programming manager 113 writes the fourth page that is stored in the buffer to the first wordline. As described above with regard to operation 225, the programming manager 113 can apply an adjustment to the threshold voltage using the values of each bit included in the second of data bits to compensate for disturbance or other parasitic effects of programming the second wordline.

Figure 5:
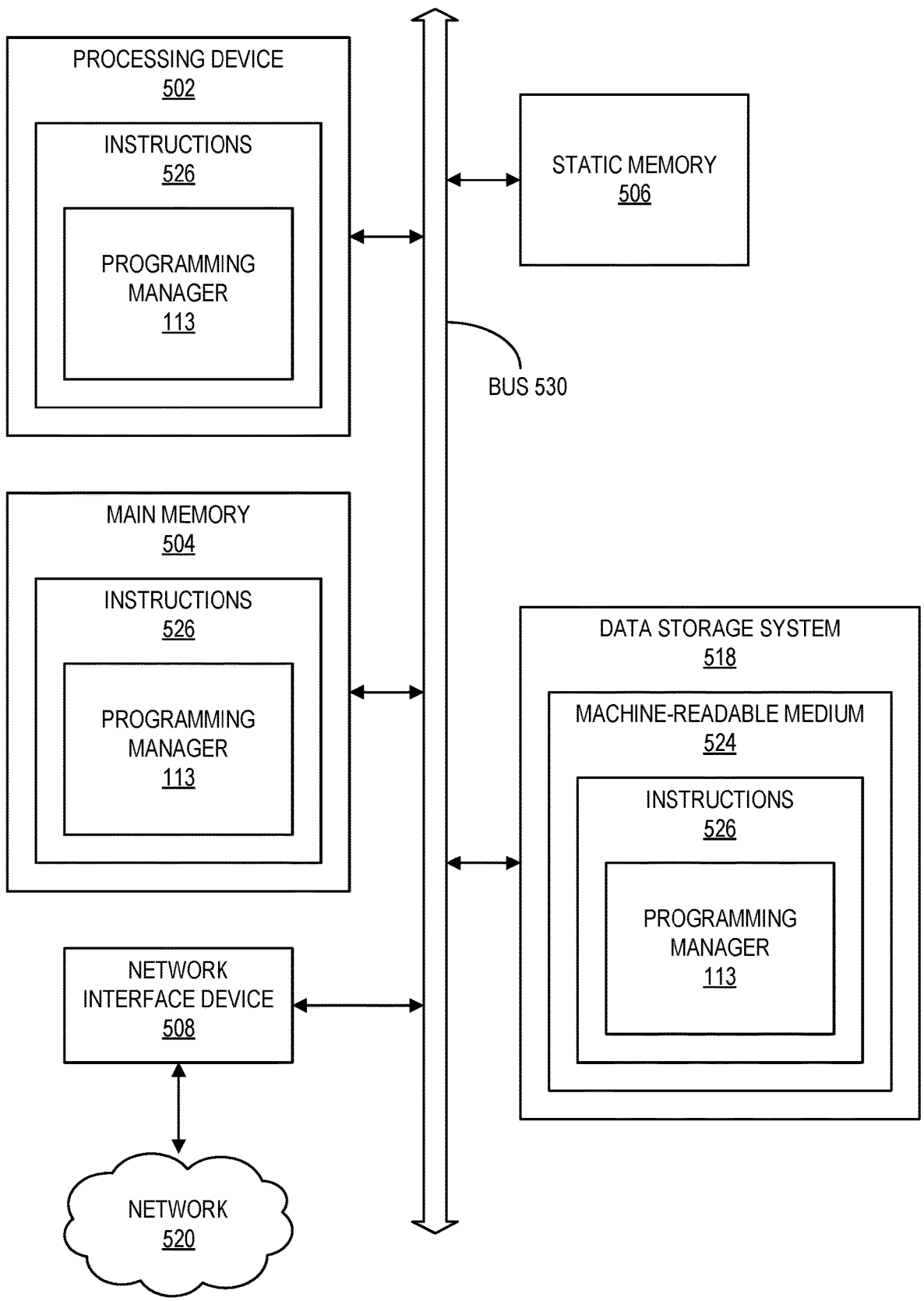
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the programming manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a programming manager (e.g., the programming manager 113 of FIG. 1). While the machine-readable storage medium 524 is shown in an example of an embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that causes the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    receiving a first set of data bits for programming to memory;
    writing a first subset of data bits of the first set to a first wordline of the memory during a first pass of programming;
    writing a second subset of data bits of the first set of data bits to a buffer, wherein the second subset of data bits is different than the first subset of data bits;
    receiving a second set of data bits for programming, wherein the second set of data bits will be programmed to a second wordline; and
    writing the second subset of data bits of the first set of data bits to the first wordline during a second pass of programming in response to receiving the second set of data bits, the writing of the second subset of data bits including an increase in bit density of memory cells in the first wordline.

2. The method of claim 1, wherein the writing the second subset of data bits includes determining an adjustment voltage for a threshold voltage of one or more bits of the second subset of data bits using the second set of data bits.

3. The method of claim 2, wherein the adjustment comprises:
    increasing the threshold voltage by a first amount for a number of bits of the second set of data bits to be programmed in a first pass of programming; and
    increasing the threshold voltage by a second amount for a different number of bits of the second set of data bits to be programmed in a first pass of programming.

4. The method of claim 1, further comprising writing a third subset of data bits from the second set of data bits to the second wordline, wherein writing the third subset of data bits causes a shift in a voltage of one or more bits of the first wordline.

5. The method of claim 1, wherein the first set of data bits includes four pages, and wherein the first subset of data bits includes three pages.

6. The method of claim 1, wherein the first subset of data bits is written in a readable state.

7. The method of claim 1, wherein the buffer is a NAND latch, an SLC block, or volatile memory.

8. A non-transitory computer-readable storage medium comprising instructions that, when executed by a processing device, cause the processing device to:
    receive a first set of pages of data for programming to memory, wherein the first set of pages includes four pages;
    write a first subset of pages to a first wordline during a first pass of programming;
    write a selected page of the first set of pages to a buffer, wherein the selected page is different than each page of the first subset of pages;
    receive a second set of pages for programming; and
    write the selected page of the first set of pages to the first wordline during a second pass of programming, wherein the writing of the selected page includes applying an adjustment voltage to the selected page using the second set of pages, wherein writing of the selected page includes increasing a bit density of memory cells in the first wordline.

9. The non-transitory computer-readable storage medium of claim 8, wherein writing the selected page is performed in response to receiving the second set of pages for programming.

10. The non-transitory computer-readable storage medium of claim 8, wherein applying an adjustment voltage comprises:
    increasing a threshold voltage by a first amount for a number of pages of the second set of pages to be programmed in a first pass of programming; and
    increasing the threshold voltage by a second amount for a different number of pages of the second set of pages to be programmed in a first pass of programming, wherein the second amount is greater than the first amount.

11. The non-transitory computer-readable storage medium of claim 8, the instructions further causing the processing device to write a third subset of pages from the second set of pages to a second wordline, wherein writing the third subset of pages causes a shift in a voltage of one or more bits of the first wordline.

12. The non-transitory computer-readable storage medium of claim 8, wherein the first set of pages includes four pages, and wherein the first subset of pages is three pages.

13. The non-transitory computer-readable storage medium of claim 8, wherein the first subset of pages is written in a readable state.

14. The non-transitory computer-readable storage medium of claim 8, wherein the buffer is a NAND latch, an SLC block, or volatile memory.

15. A system comprising:
a memory device; and
a processing device, operatively coupled with a plurality of memory device to:
receive a first set of data bits for programming to memory;
write a first subset of data bits to a first wordline during a first pass of programming;
write a second subset of data bits of the first set of data bits to a buffer, wherein the second subset of data bits is different than the first subset of data bits;
receive a second set of data bits for programming; and
write the second subset of data bits to the first wordline during a second pass of programming, wherein writing the second subset of data bits includes applying an adjustment voltage to a threshold voltage of the second subset of data bits using the second set of data bits wherein writing of the second subset of data bits includes increasing a bit density of memory cells in the first wordline.

16. The system of claim 15, wherein the buffer is a NAND latch, an SLC block, or volatile memory.

17. The system of claim 15, wherein the applying an adjustment voltage to the threshold voltage of the second subset of data bits using the second set of data bits comprises:
increasing the threshold voltage by a first amount for a number of bits of the second set of data bits to be programmed in a first pass of programming; and
increasing the threshold voltage by a second amount for a different number of bits of the second set of data bits to be programmed in a first pass of programming, wherein the second amount is greater than the first amount.

18. The system of claim 15, wherein the processing device is further caused to write a third subset of data bits from the second set of data bits to a second wordline, wherein writing the third subset of data bits causes a shift in the voltage of one or more bits of the first wordline.

19. The system of claim 15, wherein the first set of data bits includes four pages, and wherein the first subset of data bits includes three pages.

20. The system of claim 15, wherein the first subset of data bits is written in a readable state.

* * * * *